(12) United States Patent
Kido et al.

(10) Patent No.: US 7,499,318 B2
(45) Date of Patent: Mar. 3, 2009

(54) NONVOLATILE SEMICONDUCTOR MEMORY DEVICE HAVING A MANAGEMENT MEMORY CAPABLE OF SUPPRESSING BITLINE INTERFERENCE DURING A READ OPERATION

(75) Inventors: Kazunari Kido, Yokohama (JP); Shoichi Kawamura, Yokohama (JP)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 196 days.

(21) Appl. No.: 11/612,173

(22) Filed: Dec. 18, 2006

(65) Prior Publication Data
US 2007/0139990 A1    Jun. 21, 2007

(30) Foreign Application Priority Data
Dec. 21, 2005    (JP)    ............................ 2005-368793

(51) Int. Cl.
    *G11C 16/26*    (2006.01)
(52) U.S. Cl. .............................. 365/185.02; 365/185.2; 365/185.23; 365/185.33
(58) Field of Classification Search .............. 365/185.2, 365/185.33, 185.29, 185.23, 185.02
    See application file for complete search history.

(56) References Cited

U.S. PATENT DOCUMENTS 5,978,247 A * 11/1999 Lee .............................. 365/63
6,826,081 B2 * 11/2004 Nagashima et al. .... 365/185.09
6,925,005 B2 * 8/2005 Kawamura et al. ..... 365/185.12

FOREIGN PATENT DOCUMENTS

| JP | 08-222706      | 8/1996    |
|----|----------------|-----------|
| JP | 9-245493       | * 9/1997  |
| JP | 2004-193483    | * 7/2004  |
| KR | 10199900002475 | 4/1990    |
| KR | 1019940008132  | 9/1994    |
| KR | 100206709      | 4/1999    |

OTHER PUBLICATIONS

English Abstract for Publication No. 10199900002475.
English Abstract for Publication No. 1019940008132.
English Abstract for Publication No. 08-222706.
English Abstract for Publication No. 100206709.
English Abstract for Publication No. 2004-193483.

* cited by examiner

*Primary Examiner*—Andrew Q Tran
(74) *Attorney, Agent, or Firm*—F. Chau & Associates, LLC

(57) ABSTRACT

A nonvolatile semiconductor memory device has a high read output and is not affected by a noise of adjacent bit lines. The memory device is capable of performing high speed read operations. Each bit of a memory as formed by a plurality of memory cells. The memory cells each have the same structure as the structure of a memory cell of the main memory. During a read operation, the bit line is selected and proximate bit lines proximate to the selected bit line are not selected. The nonvolatile semiconductor memory device is formed together with the main memory on one chip by the same process.

12 Claims, 3 Drawing Sheets

NONVOLATILE SEMICONDUCTOR MEMORY DEVICE HAVING A MANAGEMENT MEMORY CAPABLE OF SUPPRESSING BITLINE INTERFERENCE DURING A READ OPERATION

CROSS-REFERENCE TO RELATED APPLICATION

This application claims priority under 35 U.S.C. § 119 to Japanese Patent Application No. 2005-368793 filed on Dec. 21, 2005, the entire contents of which are hereby incorporated by reference.

BACKGROUND OF THE INVENTION

1. Technical Field

The present disclosure relates to a memory device, and more particularly, to a nonvolatile semiconductor memory device.

2. Discussion of the Related Art

In order to store more information in a memory device, the number of memory cells arranged in a matrix of intersecting word lines and bit lines is increased. A semiconductor memory chip of a 100 Mbit-class is commonly used and methods of its use tend to be varied and complex. Therefore, in order to efficiently utilize a main memory, operation management for the main memory may be performed. For example, information on software for a mapping operation of a memory map may be controlled. Information on hardware of a memory array may be modified due to a redundant configuration. These actions may be executed separate from user memory operations.

Therefore, condition data used to manage the main memory is stored in a management memory and is installed separately from the man memory. The condition data is protected from user manipulation. Also, since operation management for a memory is performed before a user performs an operation, management memory should be capable of operating at a high speed (relative to the read speed) without an operation error.

FIG. 4 is a circuit diagram of a conventional memory.

Referring to FIG. 4, four memory cells 1 through 4 forming 1 bit are formed in intersection points between four bit lines 5 through 8 and a word line 18, respectively. The four bit lines 5 through 8 are connected to source terminals of bit line select transistors 9 through 12, respectively. Drain terminals of the bit line select transistors 9 through 12 are connected to a source terminal of a bit line group select transistor 13. A gate terminal of the bit line group select transistor 13 and gate terminals of the bit line select transistors 9 through 12 are connected to a bit select circuit 15 through select lines 16 and 17, respectively, and a drain terminal of the bit line group select transistor 13 is connected to a read circuit 14-1.

The word line 18 is connected to a word driver 19, and dummy word lines 20 are connected to a Vss. Vss lines 21 are Vss lines of the memory cells and run in a word line direction. A coupling capacitance 22 between bit lines represents a line capacitance of adjacent bit lines between cell arrays forming 1 bit respectively. In FIG. 4, as the memory cells 1 through 4 form 1 bit, a plurality of bits are formed in one word line.

For example, when memory cells corresponding to 2 bits connected to read circuits 14-1 and 14-2 are read and selected by the bit select circuit 15 and the word driver 19, read signals of the memory cells 1 through 4 driven by the word driver 19 are input to the read circuit 14-1 through the bit line select transistors 9 through 12. The bit line group select transistor 13 is selected by the bit lines 5 through 8 and the bit select circuit 15 respectively. Similarly, read signals of the adjacent memory cells are input to the read circuit 14-2.

During a read operation, a read signal of the bit line 8 and a read signal of the adjacent bit line interfere with each other through the coupling capacitance 22 between bit lines, and thus input signals of the read circuits 14-1 and 14-2 affect each other as a noise. Therefore, due to a noise from the adjacent bit line, the plurality of memory cells may not be read at a sufficiently high read speed and operational error may not be adequately prevented. An example of a nonvolatile semiconductor memory device that seeks to prevent variation of one bit line from affecting other bit line is Japanese Patent Publication No. HEI9-245493.

SUMMARY OF THE INVENTION

Exemplary embodiments of the present invention provide a nonvolatile semiconductor memory device including a main memory and a management memory. The device has a high read output and the effect of noise from adjacent bit lines is minimized or eliminated. The device can perform a read operation at a high speed while minimizing or eliminating operation error.

Exemplary embodiments of the present invention provide non volatile semiconductor memory devices including a main memory and a management memory. The management memory stores condition data for an inside processing to perform an operation management for the main memory. One bit of the management memory is formed by a plurality of memory cells. The plurality of memory cells are disposed in a line along a word line. A predetermined number of the memory cells are arranged in an array field in word line and bit line directions. The word line is driven by a word driver. The bit line transfers a read output signal to a read circuit through a bit line select transistor to perform a read operation. In the read operation, bit lines that are proximate to the selected bit line are not selected.

According to some exemplary embodiments, a memory cell array of the management memory includes a memory cell region that operates as the management memory and a dummy memory cell region that does not operate as a memory.

According to other exemplary embodiments, the memory cells have the same structure as the structure of the main memory. The management memory is formed together with the main memory on one chip by the same process.

According to other exemplary embodiments, the memory cells have a flash memory cell structure.

BRIEF DESCRIPTION OF THE DRAWINGS

The drawings illustrate exemplary embodiments of the present invention and, together with the description, serve to explain principles of the present disclosure. In the drawings.

DETAILED DESCRIPTION OF EXEMPLARY EMBODIMENTS

An exemplary embodiment of the present invention is described below in conjunction with the accompanying drawings.

Figure 1:
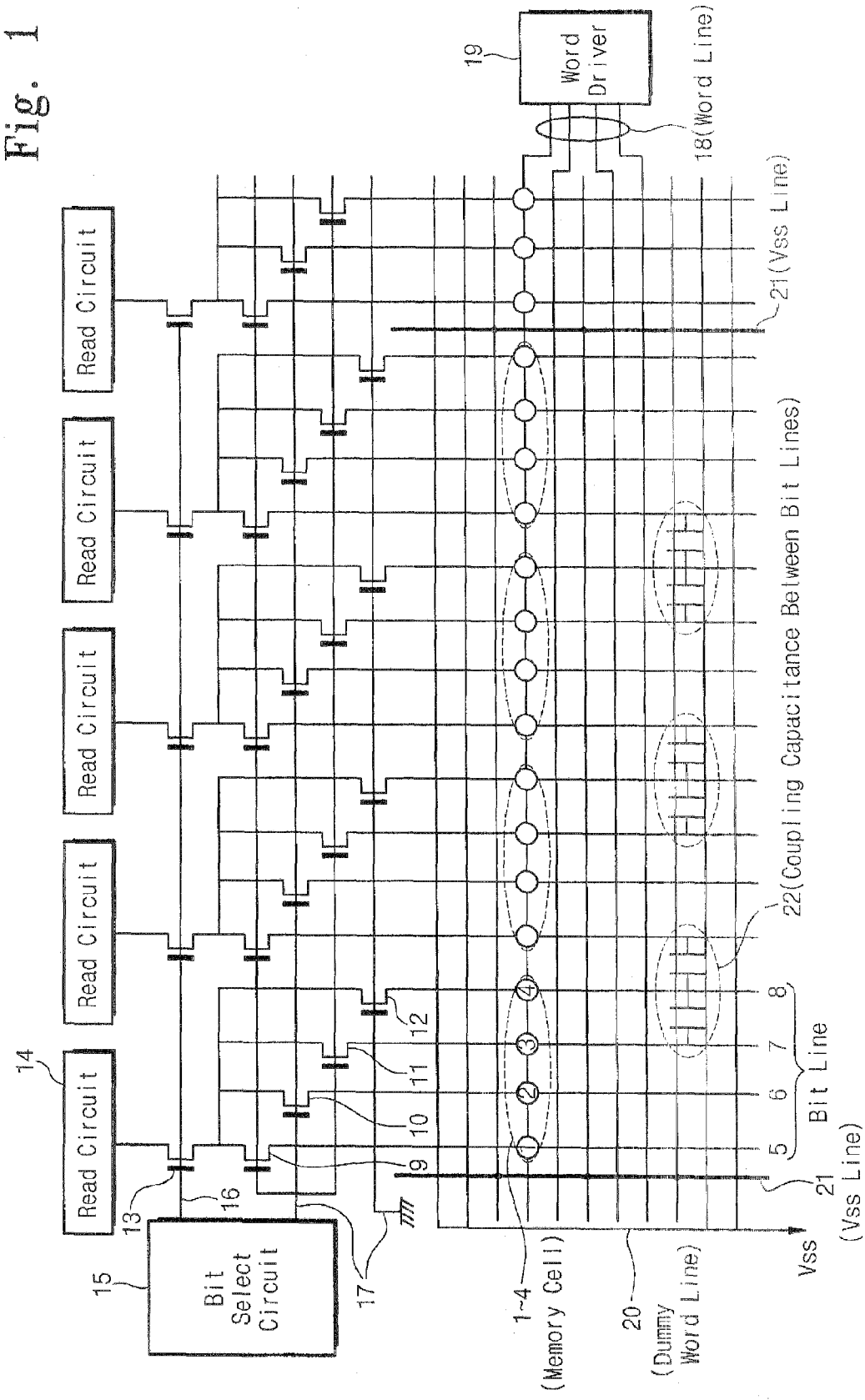
FIG. 1 is a circuit diagram of a management memory of a nonvolatile semiconductor memory device according to an exemplary embodiment of the present invention.

FIG. 1 is a circuit diagram of a management memory of a nonvolatile semiconductor memory device according to an exemplary embodiment of the present invention.

Referring to FIG. 1, a select line 17 of a bit line select transistor 12 is connected to a ground. Dummy memory cell arrays are formed in both sides of operational memory cell arrays and dummy word lines 20 are connected to a Vss.

Since the select line 17 is at a ground level, the bit line select transistor 12 remains off. Therefore, although a word line of a memory cell 4 is driven by a word driver 19 connected to word lines 18, and the memory cell 4 is read, a read sign is not transferred to a read circuit 14. Meanwhile, since an initial state of a memory cell is an erase state, in such a read state, when the word line 18 is driven by the word driver 19, the memory cell 4 is turned on and a potential of a bit line 8 becomes a ground level. Accordingly, although output signals output to an adjacent bit line forming 1 bit and a bit line 7 that are adjacent to the bit line 8 interfere with each other through a coupling capacitance between each bit line and the bit line 8, the bit line 8 is at a ground level, thus preventing a noise interference.

Figure 2:
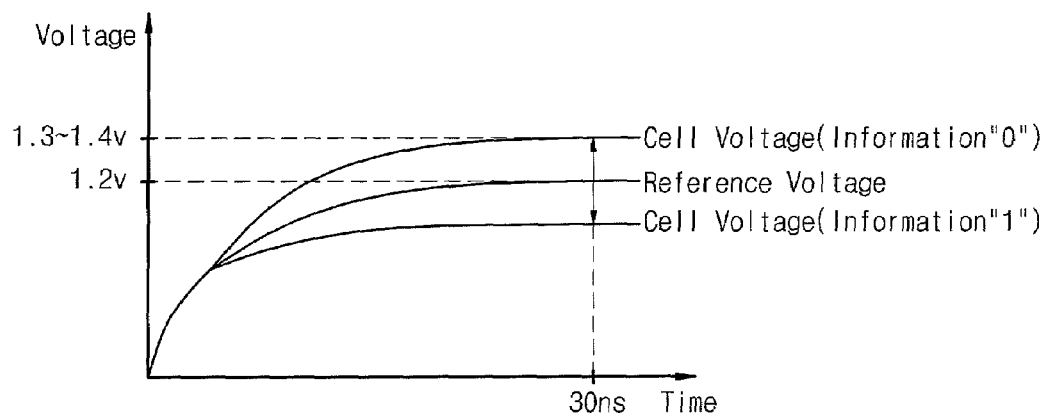
FIG. 2 is a graph illustrating a characteristic of an output signal when a read operation is performed by a conventional memory structure.

FIG. 2 illustrates an initial characteristic of an input signal in a read circuit in a conventional memory array structure in which adjacent bit lines interfere with each other. When a reference potential is 1.2 V, and an input level of information '0' is set from approximately 1.3 V to approximately 1.4 V or higher, it takes 30 ns to reach the input level.

Figure 3:
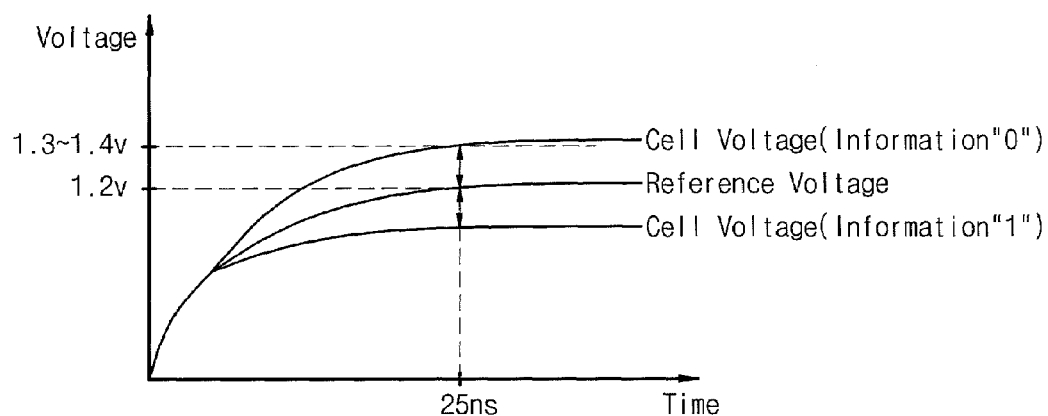
FIG. 3 is a graph illustrating a characteristic of an output signal when a read operation is performed in a memory structure of a management memory according to an exemplary embodiment of the present invention.
Figure 4:
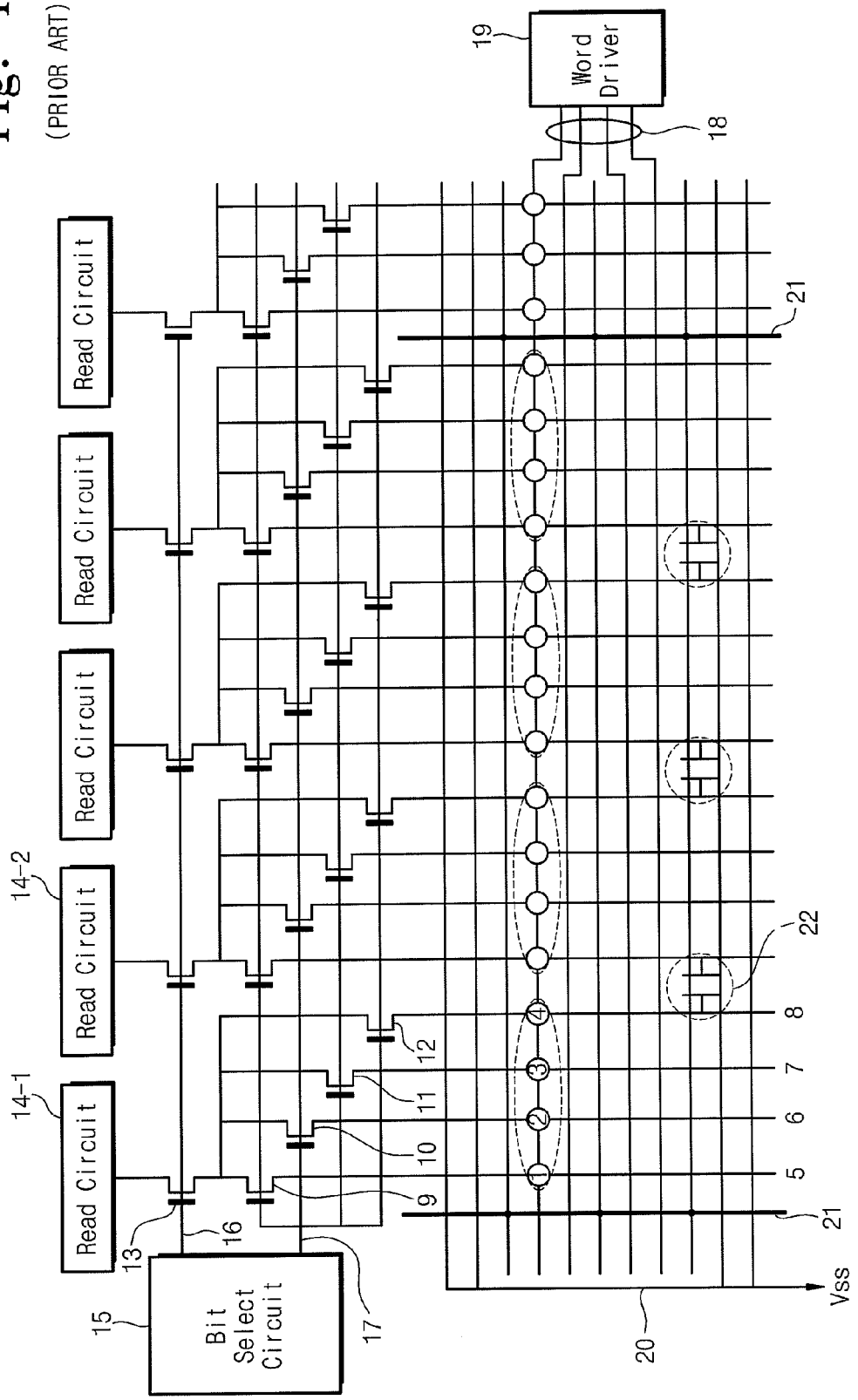
FIG. 4 is a circuit diagram of a conventional memory.

FIG. 3 illustrates an initial characteristic of an input signal in a read circuit in a memory array structure in which adjacent bit lines are prevented from interfering with each other according to an exemplary embodiment of the present invention. When a voltage level of information '0' input to the read circuit is set to the same level as the conventional level, and a noise redundancy is given to a voltage level of information '1', it takes approximately 25 ns to reach the input level, and a high speed read operation can be performed. As a read time is reduced in the high speed read, a management memory may operate before a main memory begins to operate, thus obtaining enough time to manage and control the main memory.

In the memory array structure illustrated in FIG. 1, dummy memory arrays represented as a dummy word line are disposed in both sides of the memory array having a predetermined memory capacity. A memory having a predetermined amount of the dummy memory arrays is formed on one chip together with a main memory by the same process. Therefore, the processing of the memory array may be combined with the processing of the main memory, thus the memory array and the main memory may share operation properties.

In a nonvolatile semiconductor memory device, for example a flash memory device, the number of memory cells forming 1 bit may be set to any desired number. The management memory may be of a several Kbit-class while the main memory may be of a 100 Mbit-class. Therefore, for example, memory cells corresponding to 1 Kbit (1024 bits*4 memory cells) are formed in a word line direction. A plurality of word lines are arranged on a 1024 bit*4 basis in a bit line direction to constitute a memory cell array. Therefore, in FIG. 1, the memory array is constituted on 1024 bit*4 basis and dummy memory cell arrays corresponding to two word lines are added to both sides of the memory cell array.

As described above, according to an exemplary embodiment of the present invention, a read output is large, adjacent bit lines are not affected by a noise of each other, and a high-speed read operation can be performed without an operation error. Therefore, a nonvolatile semiconductor memory device in which a main memory, and the management memory are integrally formed in a semiconductor chip can be provided.

The above-disclosed subject matter is to be considered illustrative, and not restrictive, and the appended claims are intended to cover all such modifications, enhancements, and other embodiments, which fall within the true spirit and scope of the present disclosure.

What is claimed is:

1. A nonvolatile semiconductor memory device, comprising:
   a main memory; and
   a management memory storing condition data for an inside processing to perform an operation management for the main memory,
   wherein each bit of the management memory comprises a plurality of memory cells;
   the plurality of memory cells are disposed in a line along a word line, and the plurality of memory cells are arranged in a memory cell array in a word line direction and a bit line direction;
   the word line is driven by a word driver, and a bit line transfers a read output signal to a read circuit through a bit line select transistor to perform a read operation; and
   in the read operation, the bit line is selected and proximate bit lines proximate to the selected bit line are not selected.

2. The nonvolatile semiconductor memory device of claim 1, wherein the memory cell array of the management memory comprises a memory cell region that operates as the management memory and a dummy memory cell region that does not operate as the management memory.

3. The nonvolatile semiconductor memory device of claim 1, wherein the plurality of memory cells have the same structure as a structure of the main memory, and the management memory is formed together with the main memory on a single chip by a single process.

4. The nonvolatile semiconductor memory device of claim 1, wherein each of the plurality of memory cells has a flash memory cell structure.

5. A method for reading a nonvolatile semiconductor memory device, the memory device comprising a main memory and a management memory, the method comprising:
   storing condition data for an inside processing to perform an operation management for the main memory, wherein each bit of the management memory comprises a plurality of memory cells, the plurality of memory cells are disposed in a line along a word line, and the plurality of memory cells are arranged in a memory cell array in a word line direction and a bit line direction;
   driving the word line by a word driver;
   performing a read operation by using a bit line to transfer a read output signal to a read circuit through a bit line select transistor; and
   in the read operation, the bit line is selected and proximate bit lines proximate to the selected bit line are not selected.

6. The method of claim 5, wherein the memory cell array of the management memory comprises a memory cell region that operates as the management memory and a dummy memory cell region that does not operate as the management memory.

7. The method of claim 5, wherein the plurality of memory cells have the same structure as a structure of the main memory, and the management memory is formed together with the main memory on a single chip by a single process.

8. The method of claim 5, wherein each of the plurality of memory cells has a flash memory cell structure.

9. A nonvolatile semiconductor memory device, comprising:
- a main memory; and
- a management memory storing condition data for an inside processing to perform an operation management for the main memory,
- wherein each bit of the management memory comprises a plurality of memory cells;
- the plurality of memory cells are disposed in a two-dimensional matrix in a word line direction and a bit line direction and each of the plurality of memory cells is connected to a corresponding word line from among a plurality of word lines and a corresponding bit line from among a plurality of bit lines;
- in a read operation to read the plurality of memory cells, a selected bit line from among the plurality of bit lines is selected by a bit selection circuit and proximate bit lines proximate to the selected bit line are not selected.

10. The nonvolatile semiconductor memory device of claim 9, wherein the matrix of memory cells of the management memory comprises a memory cell region that operates as the management memory and a dummy memory cell region that does not operate as the management memory.

11. The nonvolatile semiconductor memory device of claim 9, wherein the plurality of memory cells have the same structure as a structure of the main memory, and the management memory is formed together with the main memory on a single chip by a single process.

12. The nonvolatile semiconductor memory device of claim 9, wherein each of the plurality of memory cells has a flash memory cell structure.

* * * * *